(12) United States Patent
Tomizawa et al.

(10) Patent No.: US 11,762,436 B2
(45) Date of Patent: Sep. 19, 2023

(54) DISPLAY DEVICE, METHOD FOR MANUFACTURING DISPLAY DEVICE, AND PRINTED WIRING BOARD

(71) Applicant: SHARP KABUSHIKI KAISHA, Sakai (JP)

(72) Inventors: Hitoshi Tomizawa, Sakai (JP); Atsuji Okada, Sakai (JP); Yohichiroh Sakaki, Sakai (JP); Mitsuhiro Sugimoto, Sakai (JP); Hiroaki Nakaminami, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/988,993

(22) Filed: Nov. 17, 2022

(65) Prior Publication Data
US 2023/0071011 A1     Mar. 9, 2023

Related U.S. Application Data

(63) Continuation of application No. 17/113,626, filed on Dec. 7, 2020, now Pat. No. 11,543,867.

(30) Foreign Application Priority Data

Dec. 13, 2019 (JP) ................................ 2019-225611

(51) Int. Cl.
*H05K 1/18* (2006.01)
*G06F 1/18* (2006.01)
*H05K 1/02* (2006.01)

(52) U.S. Cl.
CPC ............. *G06F 1/189* (2013.01); *H05K 1/028* (2013.01)

(58) Field of Classification Search
CPC .... G06F 1/189; H05K 1/028; H05K 2201/05; H05K 2201/051; H05K 2201/052; H05K 2201/053; H05K 2201/055; H05K 2201/056; H05K 2201/057; H05K 2201/058; H05K 1/147; H05K 1/189
USPC .......................................................... 361/749
See application file for complete search history.

(56) References Cited

U.S. PATENT DOCUMENTS

| 2008/0005897 | A1* | 1/2008 | Nakanishi | ........... | H01L 23/4985 29/829 |
| 2016/0212838 | A1* | 7/2016 | Lee | .......................... | H05K 1/09 |
| 2020/0073497 | A1* | 3/2020 | Motonishi | ............... | G06F 3/047 |

* cited by examiner

*Primary Examiner* — Binh B Tran
(74) *Attorney, Agent, or Firm* — ScienBiziP, P.C.

(57) ABSTRACT

A flexible circuit board includes a plurality of first wires that have a first connection area and a first insulating layer that covers the first wires such that the first connection area is exposed. A printed circuit board includes a plurality of second wires that have a second connection area, a second insulating layer that covers the second wires such that the second connection area is exposed, and a plurality of island conductors adjacent to the second wires across a gap. The second connection area is covered with an anisotropic conductive layer. Each of the second wires in the second connection area at least partially faces a corresponding one of the wires in the first connection area across the anisotropic conductive layer. The plurality of island conductors include an island conductor that is in contact with the anisotropic conductive layer and partially exposed from the anisotropic conductive layer.

20 Claims, 7 Drawing Sheets

DISPLAY DEVICE, METHOD FOR MANUFACTURING DISPLAY DEVICE, AND PRINTED WIRING BOARD

The present application is a continuation application of U.S. patent application Ser. No. 17/113,626, filed on Dec. 7, 2020. The present disclosure contains subject matter related to that disclosed in Japanese Priority Patent Application JP 2019-225611 filed in the Japan Patent Office on Dec. 13, 2019, the entire contents of which are hereby incorporated by reference.

BACKGROUND

1. Field

The present disclosure relates to a display device, a method for manufacturing the display device, and a printed wiring board.

2. Description of the Related Art

Currently, active matrix display devices (hereinafter, simply referred to as "display devices"), such as liquid crystal display devices and organic EL display devices, which have a TFT for each pixel are widely used. A display device includes a display panel, a drive circuit, and a control circuit.

Examples of the drive circuit if include a driver IC used in a state of being mounted on a film-like circuit board (COF), in many cases (for example, Japanese Unexamined Patent Application Publication No. 2001-331122). The drive circuit is connected to the control circuit, for example, via a printed circuit board (PCB). The film-like circuit board (flexible circuit board) on which the driver IC is mounted is hereinafter referred to as a "COF board". Moreover, the printed circuit board before an electronic component is mounted thereon is referred to as a "printed wiring board".

The COF board and the printed circuit board are connected by being heated and pressed with an anisotropic conductive film (ACF) held therebetween. A layer formed of the ACF through the heating and pressing process between the COF board and the printed circuit board is referred to as an "anisotropic conductive layer". The anisotropic conductive layer electrically connects and mechanically bonds the COF board and the printed circuit board.

According to the investigation by the inventors of the disclosure, there were some cases where corrosion occurred in a connection part formed by using the ACF and moisture-resistance reliability of the display device was degraded. When corrosion occurs, for example, in a connection part of the COF board, on which a source driver IC is mounted, and the printed circuit board, leakage (or a short circuit) may be caused between adjacent wires, and display failure may result. The potential difference between wires that are adjacent and connected to the source driver IC can be great, and thus leakage may readily result. Such a problem is caused not only in the connection part of the COF board and the printed circuit board but also in a connection part of another flexible circuit board (such as a tape carrier package (TCP)) and the printed circuit board. Moreover, in accordance with enhancement of image resolution of a display device, the problem becomes more conspicuous as the pitch between wires decreases.

The disclosure is made in view of the aforementioned problem and provides a display device in which occurrence of corrosion in a connection portion formed between a flexible circuit board and a printed circuit board by using an ASP is suppressed, a method for manufacturing such a display device, and a printed wiring board used in such a display device.

SUMMARY

According to an embodiment of the disclosure, solutions described in the following items are provided.

[Item 1]

An aspect of the disclosure provides a display device including: a display panel; a flexible circuit board that is connected to the display panel; a glinted circuit board that is connected to the flexible circuit board; and an anisotropic conductive layer that connects the flexible circuit board and the printed circuit board, in which the flexible circuit board includes a first substrate, a plurality of first wires that are supported by the first substrate and that have a first connection area which includes ends of the plurality of first wires, and a first insulating layer that covers the plurality of first wires such that the first connection area is exposed, the printed circuit board includes a second substrate, a plurality of second wires that are supported by the second substrate and that have a second connection area which includes ends of the plurality of second wires, a second insulating layer that covers the plurality of second wires such that the second connection area is exposed, and a plurality of island conductors that are supported by the second substrate and that are adjacent to respective ones of the ends of the plurality of second wires across a gap, the second connection area is covered with the anisotropic conductive layer, each of the plurality or second wires in the second connection area at least partially faces a corresponding one of the plurality of first wires in the first connection area across the anisotropic conductive layer, and the plurality of island conductors include an island conductor that is in contact with the anisotropic conductive layer and that is partially exposed from the anisotropic conductive layer.

[Item 2]

Another aspect of the disclosure provides a method for manufacturing the display device according to Item 1, and the method includes obtaining the anisotropic conductive layer by heating and pressing an anisotropic conductive film in a state in which the anisotropic conductive film is arranged between the flexible circuit board and the printed circuit board to thereby cure the anisotropic conductive film, in which the obtaining includes pressing a pressing tool that is arranged on a side of the flexible circuit board, which is opposite to the anisotropic conductive film, against the printed circuit board via the flexible circuit board and the anisotropic conductive film, and the gap does not overlap the pressing tool during the pressing when viewed in a direction normal to the second substrate.

[Item 3]

Still another aspect of the disclosure provides a printed wiring hoard including: a substrate; a plurality of wires that are supported by the substrate and that have a connection area which includes ends of the plurality of wires; an insulating layer that covers the plurality of wires such that the connection area is exposed; and a plurality of island conductors that are supported by the substrate and that are adjacent to respective ones of the ends of the plurality of wires across a gap.

DESCRIPTION OF THE EMBODIMENTS

Figure 1:
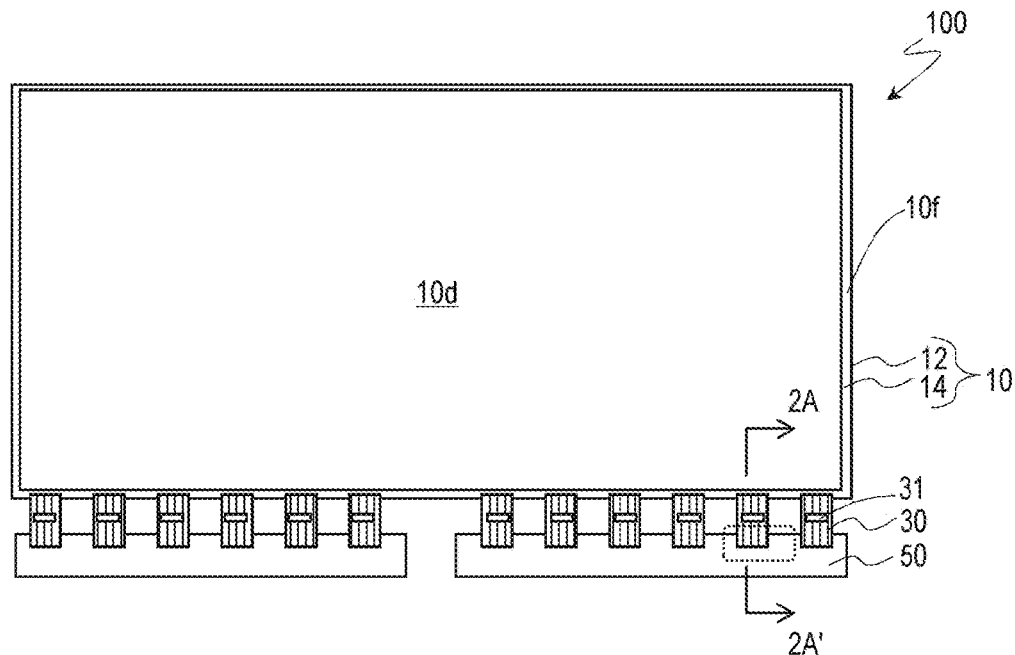
FIG. 1 is a view schematically illustrating a display device according to an embodiment of the disclosure.

A display device, a method for manufacturing the display device, and a printed wiring board according to an embodiment of the disclosure will be described below with reference to the drawings. Note that the disclosure is not limited to the embodiment exemplified below. Components having substantially the same function will be given the same reference symbol in the drawings described below, and description thereof may be omitted.

FIG. 1 is a view schematically illustrating a display device 100 according to the embodiment of the disclosure.

The display device 100 having a plurality of pixels includes a display panel 10, a COF board 30, a printed circuit board 50, and an anisotropic conductive layer 40 (refer to FIG. 2A) connecting the COF board 30 and the printed circuit board 50.

Here, the display device 100 is a liquid crystal display device, and the display panel 10 includes an active matrix substrate (TFT substrate) 12 and a counter substrate 14 with a liquid crystal layer therebetween. The active matrix substrate 12 includes a plurality of switching elements (such as TFTs) each of which is connected to a corresponding one of the plurality of pixels. That is, the active matrix substrate 12 includes at least one switching element per pixel. The display panel 10 includes a display area 10d having the plurality of pixels and a non-display area 10f other than the display area 10d. The display device 100 further includes a backlight, a polarizing plate, and the like, although not illustrated. The active matrix substrate (TFT substrate) 12 further includes a plurality of gate bus lines and a plurality of source bus lines each of which is connected to a corresponding one of the plurality of TFTs.

In this case, a drive circuit 31 that supplies a predetermined signal voltage to the plurality of switching elements is mounted on the COF board 30. For example, the source driver IC 31 that supplies a display signal voltage to the plurality of source bus lines is mounted on the COF board 30. A gate driver IC (not illustrated) that supplies a drive signal voltage to the plurality of gate bus lines can be mounted or monolithically formed on the non-display area 10f of the active matrix substrate, for example. A signal can be supplied to the gate driver IC, for example, via a non-illustrated flexible substrate. The gate driver IC may also be mounted on a short side of the display panel 10 by using the COF board similarly to the source driver IC.

The printed circuit board 50 supplies a predetermined signal to the COF board 30 (that is, to the source driver IC 31). The COF board 30 and the printed circuit board 50 are connected by the anisotropic conductive layer 40. The printed circuit board 50 is electrically connected to a non-illustrated control circuit and supplies a predetermined signal to the COF board 30 (that is, to an input terminal of the source driver IC 31) in accordance with a signal from the control circuit.

Figure 2A:
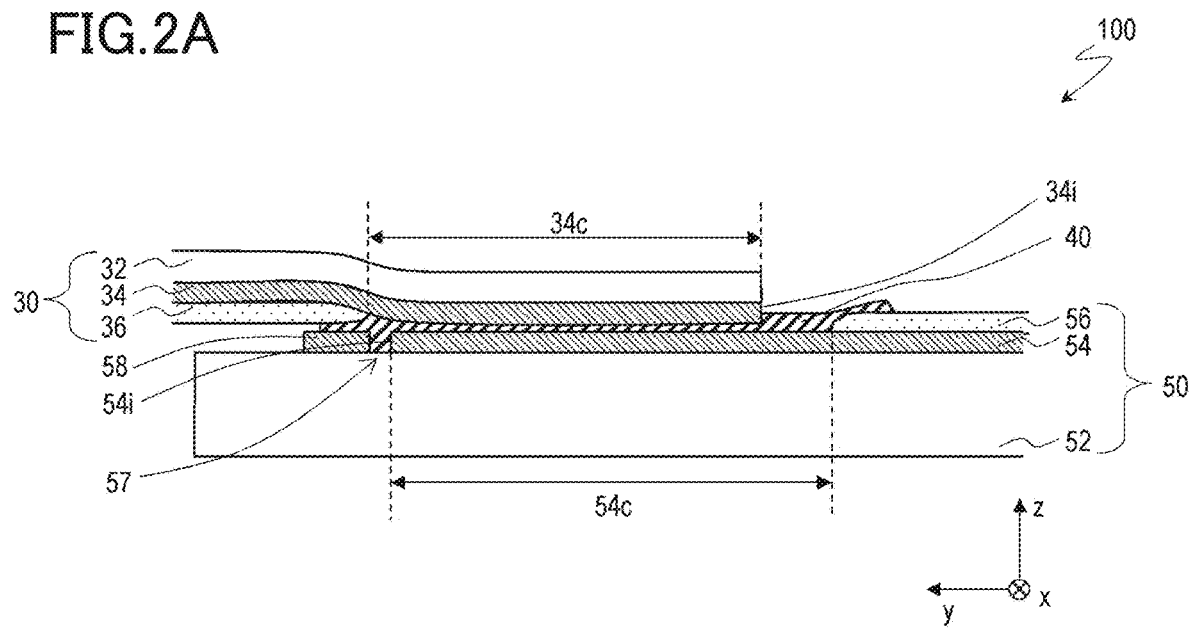
FIG. 2A is a schematic sectional view of the display device.
Figure 2B:
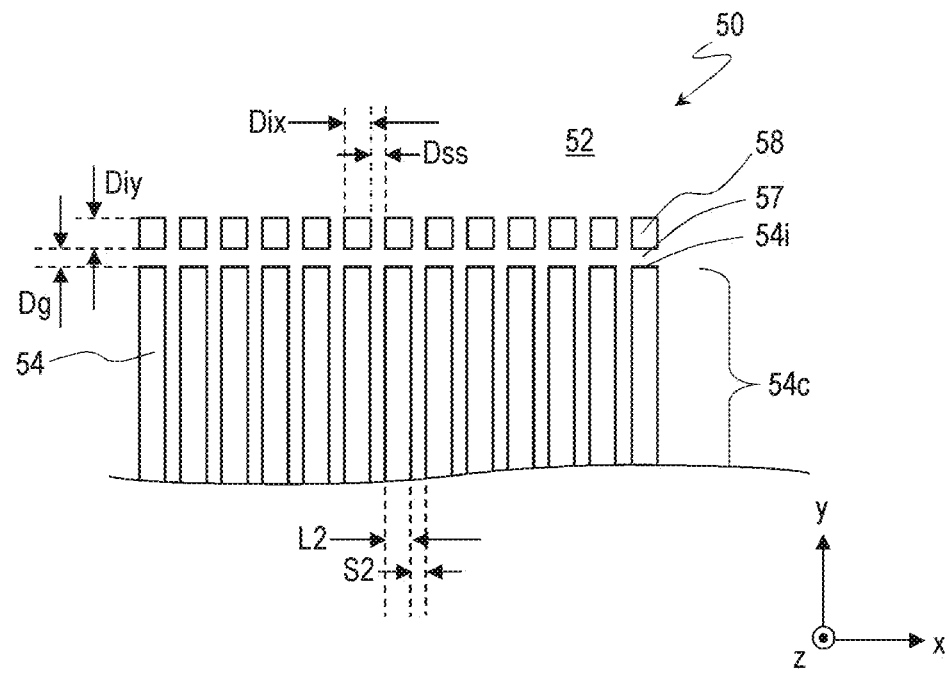
FIG. 2B is a schematic plan view of a printed circuit board included in the display device.
Figure 2C:
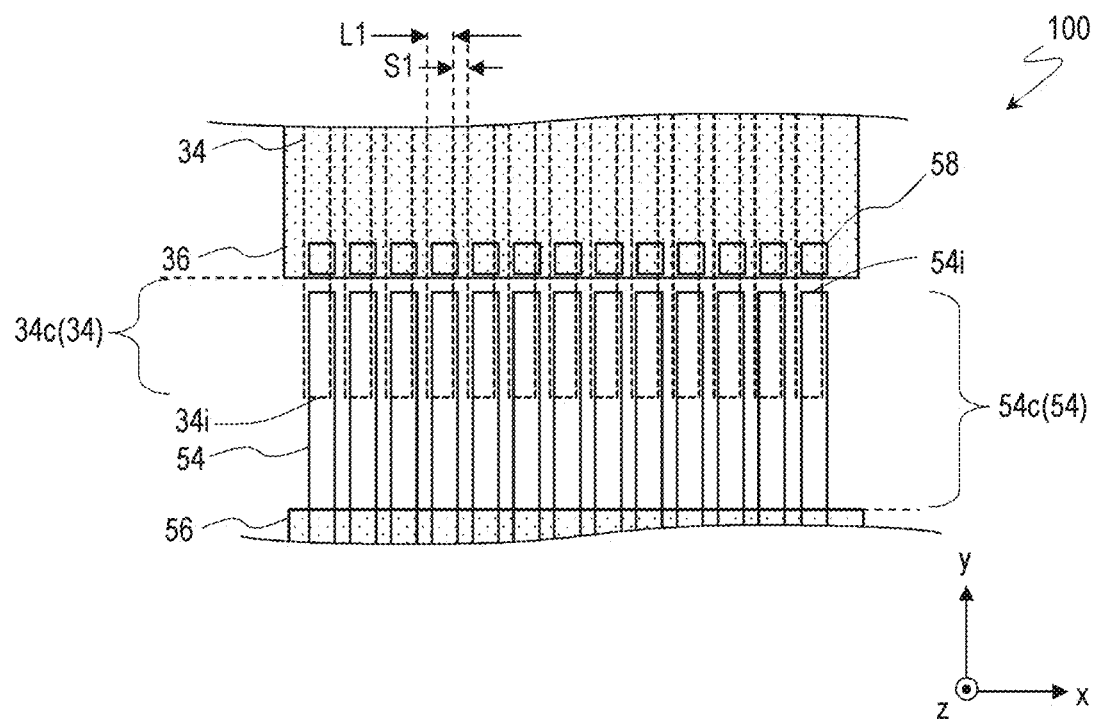
FIG. 2C is a schematic plan view for explaining connection of a COP board and the printed circuit board.
Figure 3A:
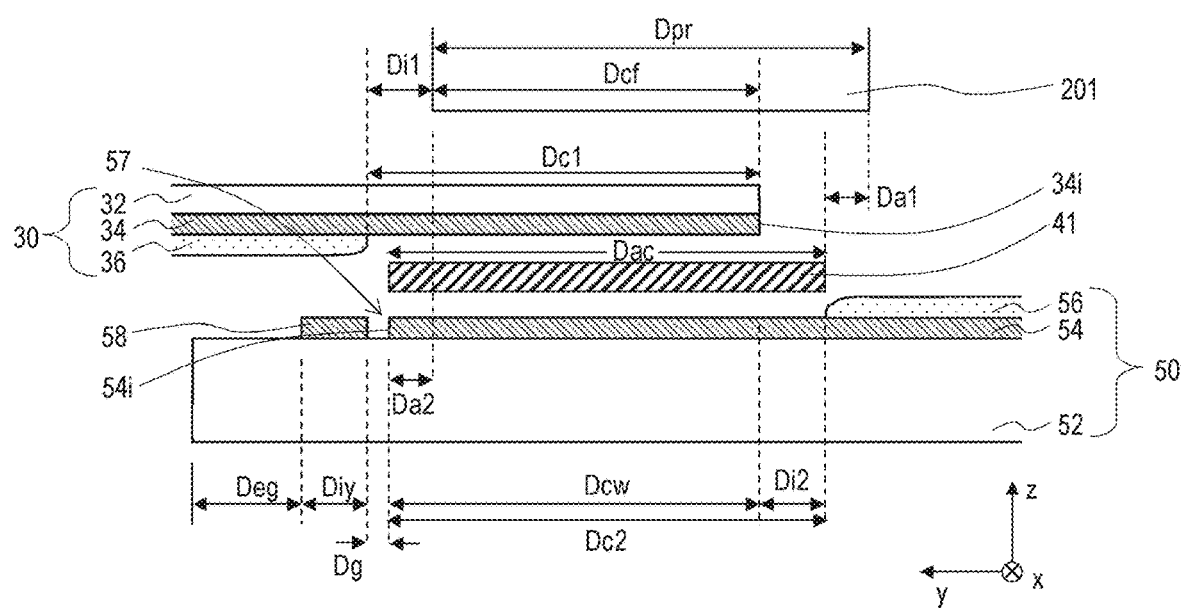
FIG. 3A is a schematic sectional view for explaining a manufacturing process of the display device.
Figure 3B:
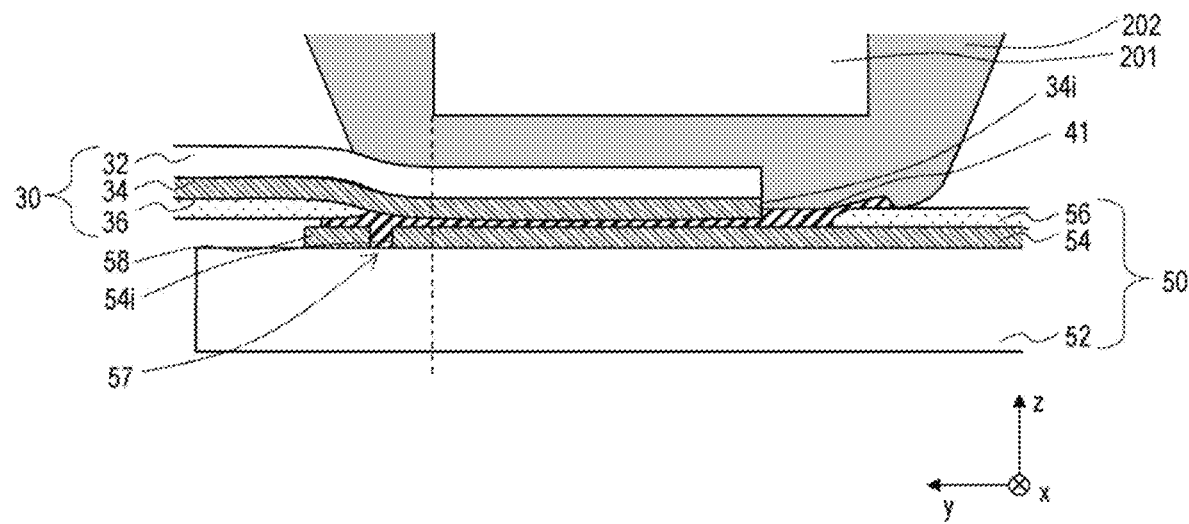
FIG. 3B is a schematic sectional view for explaining the manufacturing process of the display device.

A structure of the display device 100 and a method for manufacturing the display device 100 will be described with reference to FIGS. 2A, 2B, 2C, 3A, and 3B. FIGS. 2A, 3A, and 3B are views schematically illustrating a section of a region indicated by a broken line in FIG. 1. FIG. 2A is a schematic sectional view of the display device 100, and FIGS. 3A and 3B are schematic sectional views for explaining a manufacturing process of the display device 100. FIGS. 2A, 3A, and 3B each illustrate the section (also referred to as a yz section) that includes a direction (in the figures, the y-axis direction) in which a second wire 54 in a second connection area 54c extends and a direction (in the figures, the z-axis direction) normal to a second substrate 52. FIG. 2B is a schematic plan view of the printed circuit board 50, and FIG. 2C is a schematic plan view for explaining electrical connection of the COF board 30 and the printed circuit board 50. FIGS. 2B and 2C each illustrate a plane (also referred to as an xy plane) which is viewed in the direction (z-axis direction) normal to the second substrate 52.

The COF board 30 includes a first substrate 32, the source driver IC 31 mounted on the first substrate 32, a plurality of first wires 34 that are supported by the first substrate 32 and connected to the input terminal of the source driver IC 31, and a first insulating layer 36 that covers the plurality of first wires 34. The plurality of first wires 34 have a first connection area 34c that includes ends 34i of the first wires 34. The first insulating layer 36 covers the plurality of first wires 34 such that the first connection area 34c is exposed. The first substrate 32 is formed of, for example, a polyimide film. The drive circuit 31 mounted on the COF board 30 is not limited to the source driver IC and may be another drive circuit used for drive control of the display device 100. Alternatively, no drive circuit may be mounted on the COF board 30. In this case, the plurality of first wires 34 can be electrically connected, for example, to a terminal part which is formed in the non-display area 10f of the display panel 10.

The printed circuit board 50 includes the second substrate 52, a plurality of second wires 54 that are supported by the second substrate 52, a second insulating layer 56 that covers the plurality of second wires 54, and a plurality of island conductors 58 that are supported by the second substrate 52. The plurality of second wires 54 include the second connection area 54c that includes ends 54i of the second wires 54. The second insulating layer 56 covers the plurality of second wires 54 such that the second connection area 54c is exposed. The second substrate 52 is formed of, for example, a glass epoxy substrate. The plurality of island conductors 58 are adjacent to respective ones of the ends 54i of the plurality of second wires 54 across a gap 57. Each of the island conductors 58 has conductivity and is formed on the second substrate 52 so as to be electrically isolated from any of the other island conductors 58 and the plurality of second wires 54. When only the printed circuit board 50 is viewed, it is considered that each of the island conductors 58 is in an electrically floating state. The island conductors 58 are typically formed by patterning the same conductive film as the second wires 54. In this case, it is possible to suppress an increase in manufacturing processes and manufacturing cost.

The second connection area 54c is covered with the anisotropic conductive layer 40. Each of the plurality of second wires 54 in the second connection area 54c at least partially faces a corresponding one of the plurality of first wires 34 in the first connection area 34c across the anisotropic conductive layer 40. That is, each of the second wires 54 is electrically connected to the corresponding first wire 34 via the anisotropic conductive layer 40. The first wire 34 that is connected to the corresponding one of the second wires 54 via the anisotropic conductive layer 40 may be referred to as the first wire 34 corresponding to the second wire 54. An island conductor 58 that is adjacent to the corresponding one of the second wires 54 across the gap 57 in the y-axis direction may be referred to as the island conductor 58 corresponding to the second wire 54. A relationship between the first wire 34 and the island conductor 58 that correspond to the same second wire 54 may also be described as "corresponding".

The plurality of island conductors 58 include an island conductor 58 that is in contact with the anisotropic conductive layer 40 and partially exposed from the anisotropic conductive layer 40.

The display device 100 described above is manufactured as follows, for example.

As illustrated in FIGS. 3A and 3B, the COF board 30 and the printed circuit board 50 are heated and pressed in a state where an anisotropic conductive film 41 is arranged therebetween and are therefore thermocompression-bonded via the anisotropic conductive layer 40, resulting in an electrical connection and a mechanical bond. The thermocompression bonding is performed, for example, by pressing a pressing tool 201, which is arranged on the COF board 30 side opposite to the anisotropic conductive film 41, against the printed circuit board 50 via the COF board 30 and the anisotropic conductive film 41. The obtained anisotropic conductive layer 40 connects the COF board 30 and the printed circuit board 50.

Various types of publicly known anisotropic conductive films are usable as the anisotropic conductive film 41. For example, an anisotropic conductive film that includes an epoxy resin, an acrylic resin, or the like as a thermosetting resin and has conductive particles (for example, nickel particles having an average particle size of not less than 4 μm and not more than 8 μm) dispersed in the thermosetting resin may be used. Conditions of the thermocompression bonding are such that a heating temperature is not less than 160° C. and not more than 180° C., a pressure is not less than 3 MPa and not more than 5 MPa, and a heating and pressing time is not less than 4 seconds and not more than 6 seconds, for example.

A reason why occurrence of corrosion in a connection portion formed by using the anisotropic conductive film is suppressed in the display device 100 will be described.

Figure 6A:
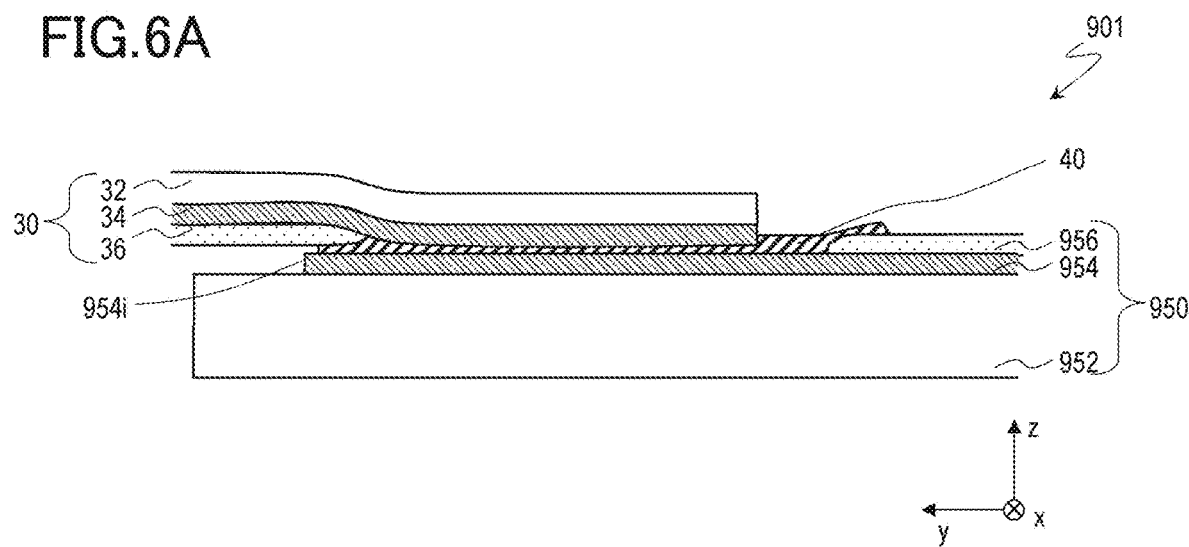
FIG. 6A is a schematic sectional view for explaining a structure of a display device of Comparative Example 1 and a manufacturing process of the display device.
Figure 6B:
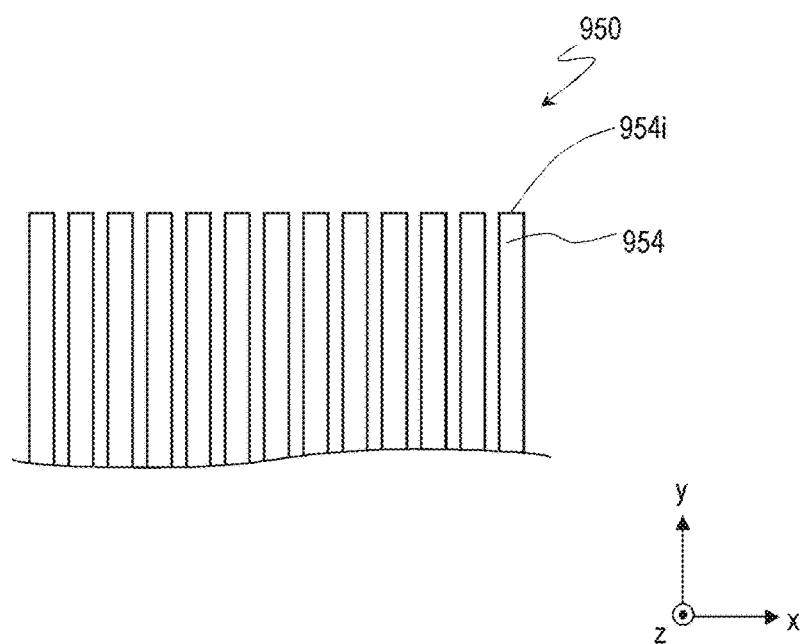
FIG. 6B is a schematic plan view of a printed circuit board included in the display device.

A mechanism by which corrosion occurs in a conventional display device 901 (also referred to as the "display device 901 of Comparative Example 1") will be described first with reference to FIGS. 6A and 6B. Note that a component having the same function as that of the component illustrated in FIG. 2A, 2B, 3A, or 3B will be indicated with the same reference symbol in FIGS. 6A and 6B, and description thereof will be omitted. FIG. 6A is a schematic sectional view for explaining a structure of the display device 901 and a manufacturing process of the display device 901. FIG. 6B is a schematic plan view of a printed circuit board 950 and illustrates a plane viewed in a direction (z-axis direction) normal to a second substrate 952.

The printed circuit board 950 of the display device 901 includes the second substrate 952, a plurality of second wires 954 that are supported by the second substrate 952, and a second insulating layer 956 that covers the plurality of second wires 954. Ends 954i of the second wires 954 on one side are exposed from the second insulating layer 956 and also exposed from the anisotropic conductive layer 40. When moisture adheres to an end 954i which is exposed, corrosion can occur in the second wire 954. Moreover, progress of the corrosion may cause leakage (or a short circuit) between adjacent second wires 954. The corrosion is likely to occur particularly at a high temperature and a high humidity.

The above-described problem may be considered to be solved by providing the anisotropic conductive layer so as to entirely cover the second wires 954 (a display device 902 of Comparative Example 2, which will be described later). However, bonding strength (peel adhesion strength) of the anisotropic conductive layer 40 to the printed circuit board 950 is high in the display device 901 compared with that of the display device 902 in Comparative Example 2.

Figure 7:
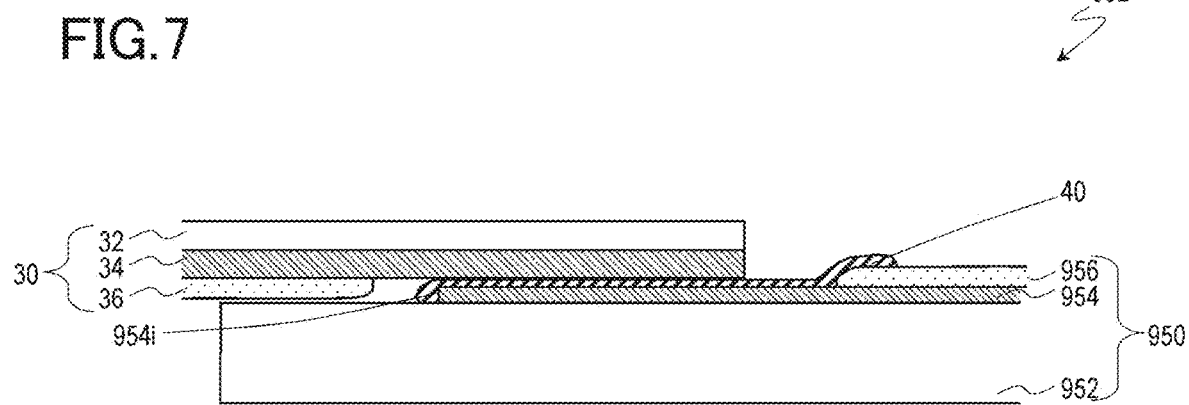
FIG. 7 is a schematic sectional view of a display device of Comparative Example 2.

FIG. 7 illustrates a schematic sectional view of the display device 902 of Comparative Example 2. The display device 902 differs from the display device 901 in that the end 954i of the second Loire 954 is not exposed from the anisotropic conductive layer 40. In the display device 901, the anisotropic conductive layer 40 does not protrude from the end 954i of the second wire 954, and an edge of the anisotropic conductive layer 40 is in contact with the second wire 954. On the other hand, in the display device 902, the anisotropic conductive layer 40 covers the end 954i of the second wire 954, and the edge of the anisotropic conductive layer 40 is not in contact with the second wire 954 but in contact with a surface of the second substrate 952.

As assessed by the following evaluation test, the difference results in high bonding strength of the anisotropic conductive layer 40 to the printed circuit board 950 in the display device 901 compared with the display device 902. The reason therefor may be considered to be an anchor effect of the second wires 954 existing under the anisotropic conductive layer 40. Moreover, it is also considered that the reason is that the bonding strength of a resin forming the anisotropic conductive layer 40 to the second wires 954 which are made of metal is higher than the bonding strength with respect to the surface of the second substrate 952. When the bonding strength in the edge of the anisotropic conductive layer 40 is low, the anisotropic conductive layer 40 is likely to peel off.

Figure 8A:
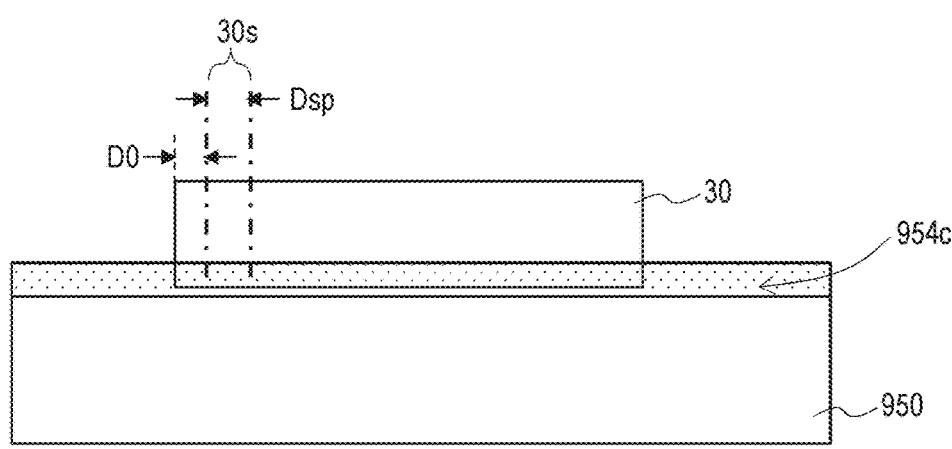
FIG. 8A is a schematic view for explaining a method of as evaluation test on the display devices.
Figure 8B:
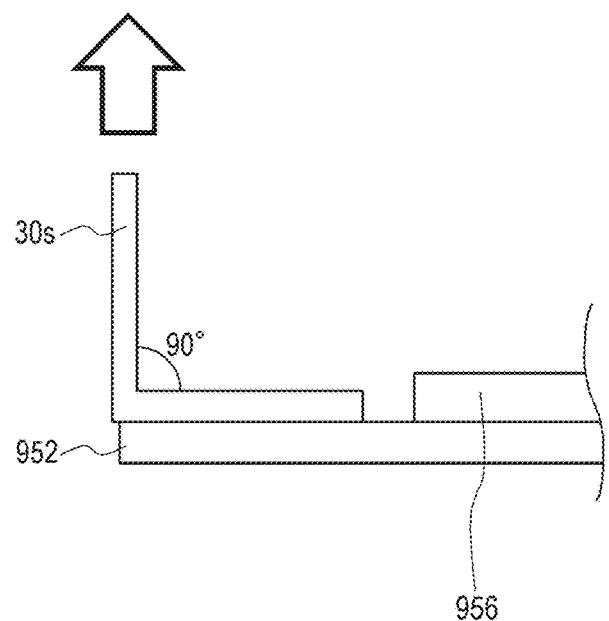
FIG. 8B is a schematic view for explaining the method of the evaluation test on the display devices.

The inventors performed a 90° peeling test on the COF board 30 by using the display device 901 of Comparative Example 1 and the display device 902 of Comparative Example 2 as a reference for evaluating the bonding strength (in this case, the peel adhesion strength) of the anisotropic conductive layer 40 to the printed circuit board 950. FIGS. 8A and 8B are schematic views for explaining a method of the evaluation test. FIG. 8A is a plan view schematically illustrating the COF board 30 and the printed circuit board 950 of the display device 901. A test piece 30s which has a width Dsp (here, Dsp=5 mm) and a tape-like shape was cut off the COF board 30 (a cut-off line is indicated by a dash-dotted line in the figure). The test piece 30s was cut off at a position apart from an edge of the COF board 30 by a distance D0 (here, D0=2 mm). The test piece 30s which had been cut off was bent outside the anisotropic conductive layer 40 and, as illustrated in FIG. 8B, pulled at a peeling-off angle of 90° with respect to the printed circuit board 950 and at a speed of 50 mm/min, and the peel adhesion strength of the anisotropic conductive layer 40 to the printed circuit board 950 was measured. The result obtained by using the display device 901 was not less than 10 N/cm. On the other hand, the result of a similar test performed by using the display device 902 was not less than 4 N/cm and not more than 6 N/cm.

For a similar reason, adhesion between the anisotropic conductive film 41 and the printed circuit board 950 in the manufacturing process is also improved in the display device 901 of Comparative Example 1 compared with that of the display device 902 of Comparative Example 2. That is, in the manufacturing process of the display device 901, since the anisotropic conductive film 41 is arranged on the second wires 954 such that the anisotropic conductive film 41 does not protrude from the ends 954i of the second wires 954, an edge of the anisotropic conductive film 41 is in contact with the second wires 954. On the other hand, in a manufacturing process of the display device 902, since the anisotropic conductive film 41 is arranged on the second wires 954 so as to cover the ends 954i of the second wires 954, the edge of the anisotropic conductive film 41 is not in contact with the second wires 954 but in contact with the surface of the second substrate 952.

In a case where the anisotropic conductive film 41 applied on a separator (a release paper or a release film) is used in a process of applying the anisotropic conductive film 41 to the printed circuit board 950, the anisotropic conductive film 41 is arranged on the second wires 954 of the printed circuit board 950 together with the separator and is caused to closely adhere to the second wires 954, and the separator is then peeled off the anisotropic conductive film 41 on the printed circuit board 950. Since the adhesion between the anisotropic conductive film 41 and the printed circuit board 950 is improved in the display device 901 compared with that of the display device 902, it is possible to easily peel off the separator while maintaining a state where the anisotropic conductive film 41 closely adheres to the second wires 954. That is, it is possible to suppress peeling of the anisotropic conductive film 41 together with the separator.

The second connection area 54c that includes the ends 54i of the second wires 54 is covered with the anisotropic conductive layer 40 in the display device 100 according to the embodiment of the disclosure. Thus, occurrence of corrosion in the second wires 54 is suppressed. Even when corrosion occurs in the island conductor 58 that is partially exposed from the anisotropic conductive layer 40, since the island conductor 58 is electrically isolated from the corresponding second wire 54 by the gap 57, the influence on the second wire 54 is small (or no influence is exerted), and corrosion of the second wire 54 is suppressed. Moreover, the first insulating layer 36 prevents the conductor 58 and the corresponding first wire 34 from forming an electrical connection via the anisotropic conductive layer 40. Although details thereof will be described later, when viewed in the direction (z-axis direction) normal to the second substrate 52, the island conductors 58 may entirely overlap the first insulating layer 36 as illustrated in FIGS. 2A and 2C. In this case, even when corrosion occurs in the island conductor 58, occurrence of corrosion of the first wire 34 or leakage between adjacent first wires 34 is suppressed.

Furthermore, the display device 100 includes the island conductor 58 that is in contact with the anisotropic conductive layer 40 and that is partially exposed from the anisotropic conductive layer 40. That is, the edge of the anisotropic conductive layer 40 is in contact with the island conductor 58, and thus the bonding strength of the anisotropic conductive layer 40 to the printed circuit board 50 is not degraded.

The island conductors 58 may be formed of a metal film (such as a Cu film) to improve adhesion to the anisotropic conductive layer 40. When a possibility of a deviation (deviation in the y-axis direction) in the alignment of the anisotropic conductive film 11 and the printed circuit board 50 is taken into account, a dimension Diy of the island conductor 58 in the y-axis direction may be, for example, not less than 0.2 mm. The dimension Diy of the island conductor 58 in the y-axis direction may be larger than, for example, a width Dg of the gap 57. Although there is no upper limit of the dimension Diy of the island conductor 58 in the y-axis direction in particular, when, for example, a size of the printed circuit board 50 or the anisotropic conductive layer 40 is taken into account, the dimension Diy is not more than 0.7 mm, for example. The dimension Diy of the island conductor 58 in the y-axis direction is, for example, less than or equal to a pitch (L2+S2) of the second wires 54 in the second connection area 54c. A dimension Dix of the island conductor 58 in the x-axis direction is the same as a width L2 (dimension in the x-axis direction) of the second wire 54, for example. The dimension Dix of the island conductor 58 in the x-axis direction may be larger than the width L2 of the second wire 54 as long as the dimension Dix of the island conductor 58 in the x-axis direction is smaller than the pitch (L2+S2) of the second wires 54. A pitch (Dix+Dss) of the island conductors 58 is substantially equal to the pitch (L2+S2) of the second wires 54 in the second connection area 54c. A space Dss between adjacent island conductors 58 is less than or equal to a space 32 between adjacent second wires 54 in the second connection area 54c, for example.

It is sufficient that the width Dg of the gap 57 (that is, a dimension of a space between each of the second wires 54 and the corresponding island conductor 58 in the y-axis direction) be set such that each of the second wires 54 and the corresponding island conductor 58 are electrically insulated. The width Dg of the gap 57 may be larger than the average particle size of the conductive particles contained in the anisotropic conductive layer 40 and is greater than or equal to 10 μm, for example. Although the conductive particles contained in the anisotropic conductive layer 40 aggregate in the resin and join in the lateral direction in some cases, by setting the width Dg of the gap 57 to, for example, twice or more the maximum particle size of the conductive particles contained in the anisotropic conductive layer 40, it is possible to reduce the possibility that the second wire 54 and the corresponding island conductor 58 have electrical continuity. The width Dg of the gap 57 is desired to be wide from the viewpoint of electrical insulation between each of the second wires 54 and the corresponding island conductor 58 but is desired to be 150 μm or less from the viewpoint of improving the bonding strength between the anisotropic conductive layer 40 and the printed circuit board 50, when, for example, accuracy of patterning in a process of forming the island conductors 58 and the second wires 54 is taken into account. The width Dg of the gap 57 may be less than or equal to the width L2 of the second wire 54 in the second connection area 54c. The width Dg of the gap 57 can be appropriately set by considering the resolution of a photomask, the size of the display panel 10, or the like.

It is sufficient that the first wires 34 and the second wires 54 be formed of a publicly known conductive film that is used for wires for a printed circuit board. The first wires 34 and the second wires 54 are formed of, for example, a metal film (here, a Cu film). In a case of, for example, a commercially available 4K 60-inch liquid crystal display device, the thickness of the first wires 34 is, for example, not less than 0.006 mm and not more than 0.010 mm, and the thickness of the second wires 54 is, for example, not less than 0.03 mm and not more than 0.04 mm. A width L1 of the first wire 34 in the first connection area 34c is, for example, not less than 0.10 mm, a width of a space S1 between adjacent first wires 34 in the first connection area 34c is, for example, not less than 0.10 mm, and a pitch (L1+S1) of the first wires 34 in the first connection area 34c is, for example, not less than 0.30 mm (for example, L1=0.14 mm and S1=0.26 mm). The width L2 of the second wire 54 in the second connection area 54c is, for example, not less than 0.15 mm, a width of the space S2 between adjacent second wires 54 in the second connection area 54c is, for example, not less than 0.10 mm, and the pitch (L2+S2) of the second wires 54 in the second connection area 54c is, for example, not less than 0.30 mm for example, L2=0.14 mm and S2=0.26 mm). The pitch (L1+S1) of the first wires 34 in the first connection area 34c and the pitch (L2+S2) of the second wires 54 in the second connection area 54c are substantially equal.

It is sufficient that the first insulating layer 36 and the second insulating layer 56 be formed of a publicly known insulating film that is used for a printed circuit board, and, in this case, examples thereof include a solder resist layer. The thickness of the first insulating layer 36 is, for example, not less than 5 μm and not more than 15 μm and is, for example, about 10 μm. The thickness of the second insulating layer 56 is, for example, not less than 15 μm and not more than 25 μm and is, for example, about 20 μm.

The anisotropic conductive layer 40 is formed of, for example, an acrylic resin in which conductive particles (nickel particles) having an average particle size of 6 μm are dispersed.

A configuration by which connection of the island conductor 58 and the corresponding first wire 34 via the anisotropic conductive layer 40 is suppressed will be described.

As in the manufacturing process of the display device 100, which is illustrated in FIG. 3B, when the pressing tool 201 is pressed against the printed circuit board 50 via the COF board 30 and the anisotropic conductive film 41, the anisotropic conductive film 41 is heated and pressed. In a process of pressing by the pressing tool 201, the gap 57 does not overlap the pressing tool 201 (condition 1) when viewed in the direction (z-axis direction) normal to the second substrate 52. At this time, the island conductors 58 do not overlap the pressing tool 201 either. Furthermore, in this case, the island conductors 58 entirely overlap the first insulating layer 36 (condition 2) when viewed in the direction (z-axis direction) normal to the second substrate 52. When conditions 1 and 2 are satisfied, the island conductor 58 and the corresponding first wire 34 are suppressed from forming connection via the anisotropic conductive layer 40. For the island conductor 58 and the corresponding first wire 34 to be suppressed from forming connection via the anisotropic conductive layer 40, at least condition 1 is desired to be satisfied, and, furthermore, condition 2 is desired to be satisfied.

Figure 9:
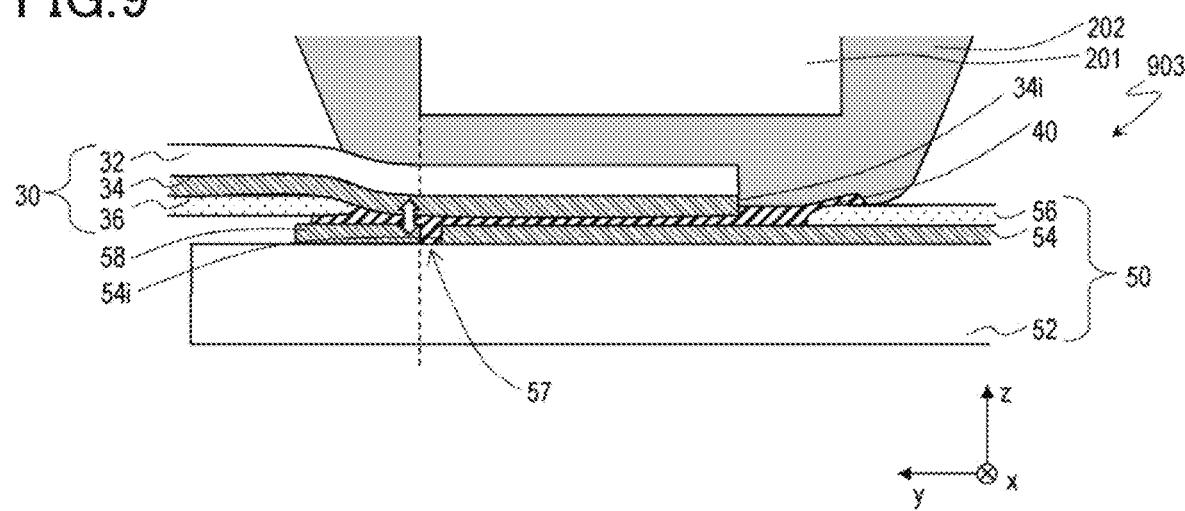
FIG. 9 is a schematic sectional view illustrating a method for manufacturing a display device of Comparative Example 3.

FIG. 9 illustrates a method for manufacturing a display device 903 of Comparative Example 3. In the method for manufacturing the display device 903 of Comparative Example 3 illustrated in FIG. 9, the gap 57 overlaps the pressing tool 201 (condition 1 is not satisfied). Furthermore, the island conductors 58 include a portion that does not overlap the first insulating layer 36 (condition 2 is not satisfied). In this case, although the island conductors 58 do not overlap the pressing tool 201, there is a possibility that the island conductor 58 and the corresponding first wire 34 are connected via the anisotropic conductive layer 40, for example, at a portion indicated by the arrow in white in the figure.

In the process of pressing by the pressing tool 201, the anisotropic conductive film 41 is heated and pressed by the pressing tool 201, for example, at a temperature of about 160° C. to 180° C. and at a pressure of about 3 Mpa to 5 Mpa for four to six seconds. Accordingly, the temperature of the pressing tool 201 itself becomes about 250° C. to 400° C. No pressure is applied to an area of the anisotropic conductive film 41, which does not overlap the pressing tool 201 when viewed in the direction (z-axis direction) normal to the second substrate 52, but the anisotropic conductive film 41 can be cured due to heat transferred from the pressing tool 201. Although the possibility that the first wire 34 and the corresponding second wire 54 (or the corresponding island conductor 58) are electrically connected via the anisotropic conductive layer 40 is low in the area which does not overlap the pressing tool 201, a connection may be established in an area near the pressing tool 201 depending on various conditions. For example, a cushion (such as silicone rubber) 202 is arranged between the pressing tool 201 and the COF board 30 in some cases, and the thickness or material of the cushion 202 can also be a factor. The thickness of the cushion 202 is, for example, about 0.2 mm to 0.5 mm.

The first insulating layer 36 is desired not to overlap the pressing tool 201 as illustrated in FIG. 3B so that a level difference generated in an area, which is pressed by the pressing tool 201, due to the thickness of the first insulating layer 36 is suppressed. Note that, on the contrary, the second insulating layer 56 may overlap the pressing tool 201. This is because a level difference generated due to the thickness of the second insulating layer 56 is reduced by the thicknesses of the first substrate 32 and the first wire 34.

Examples of dimensions indicated in FIG. 3A are described below. All of the examples indicate dimensions in the y-axis direction.

Figure 4:
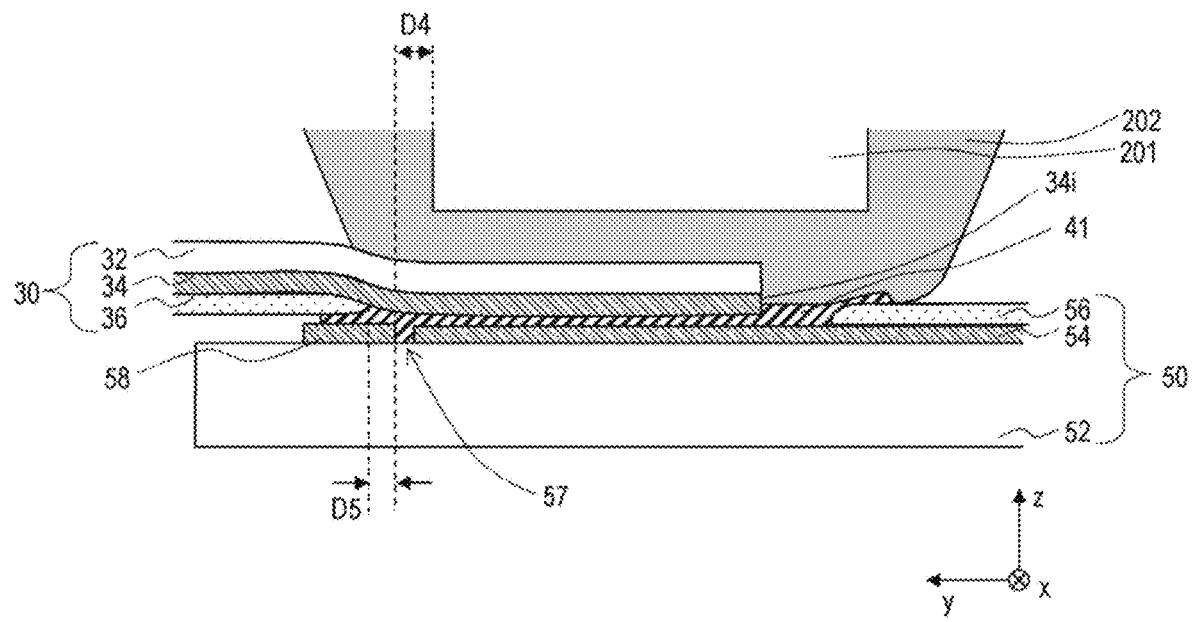
FIG. 4 is a schematic sectional view illustrating another example of a method for manufacturing the display device according to the embodiment of the disclosure.
Figure 5A:
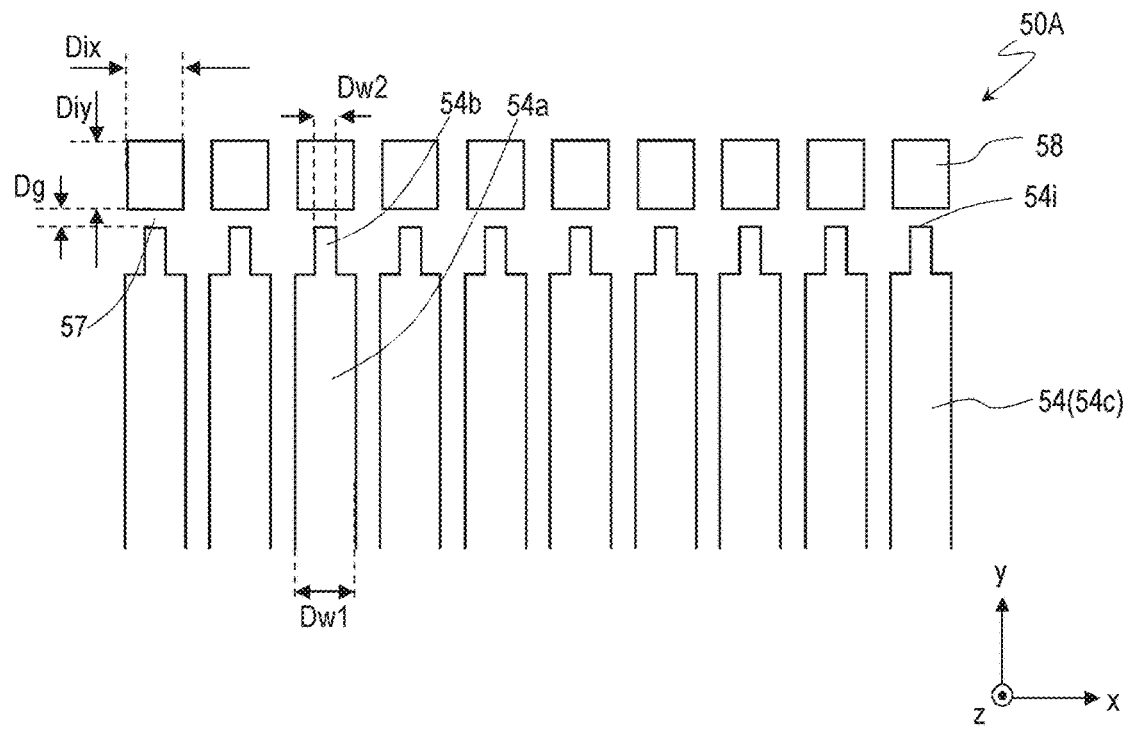
FIG. 5A is a schematic plan view of a printed circuit board included in the display device according to the embodiment of the disclosure.
Figure 5B:
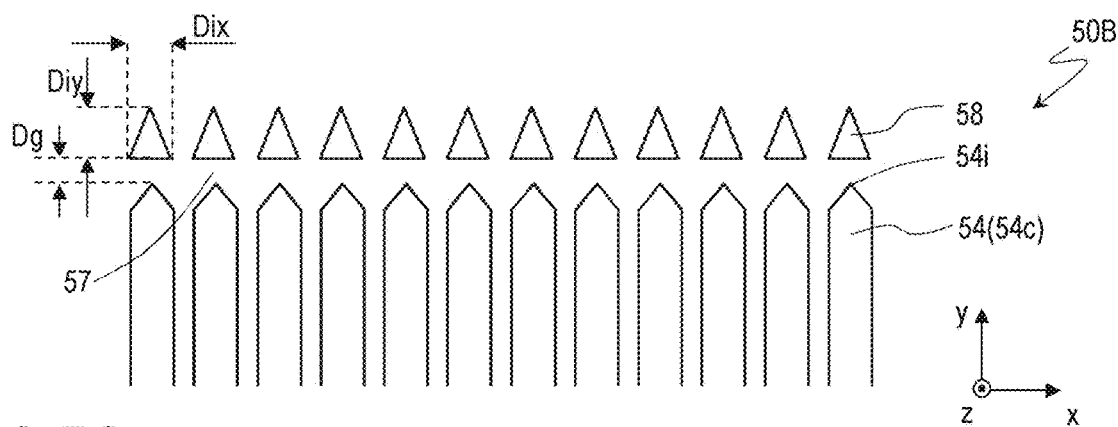
FIG. 5B is a schematic plan view of a printed circuit board included in the display device according to the embodiment of the disclosure.
Figure 5C:
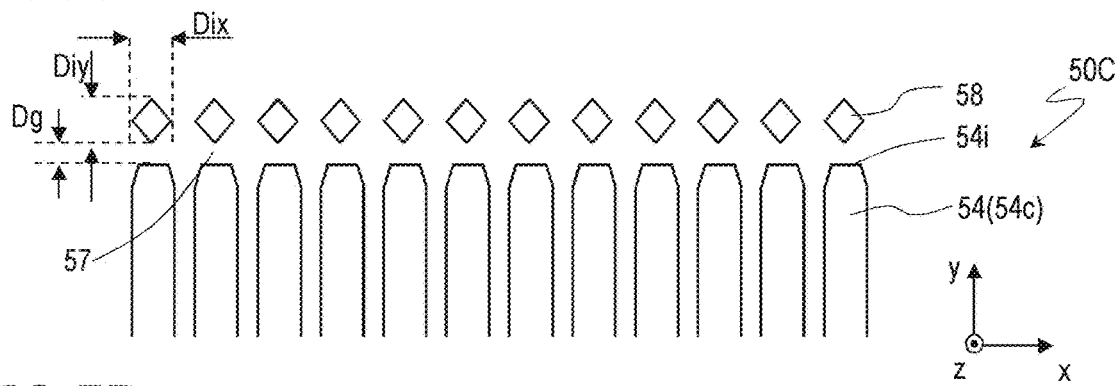
FIG. 5C is a schematic plan view of a printed circuit board included in the display device according to the embodiment of the disclosure.
Figure 5D:
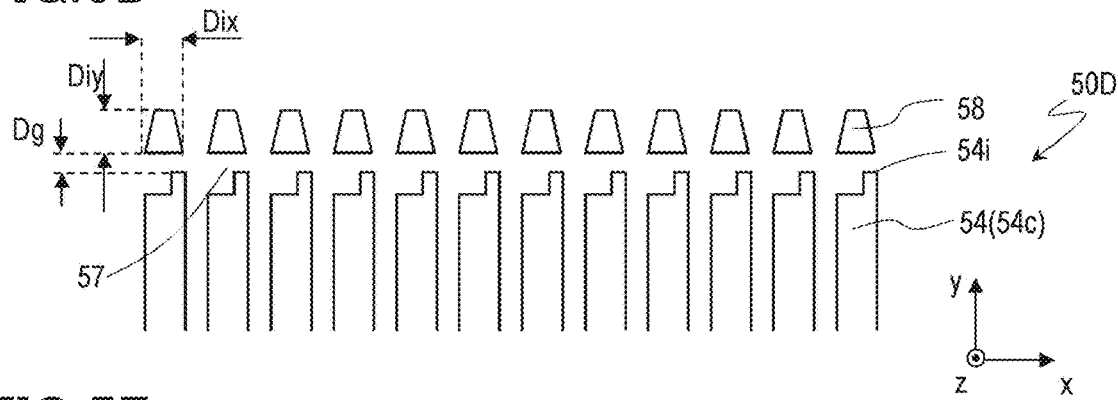
FIG. 5D is a schematic plan view of a printed circuit board included in the display device according to the embodiment of the disclosure.
Figure 5E:
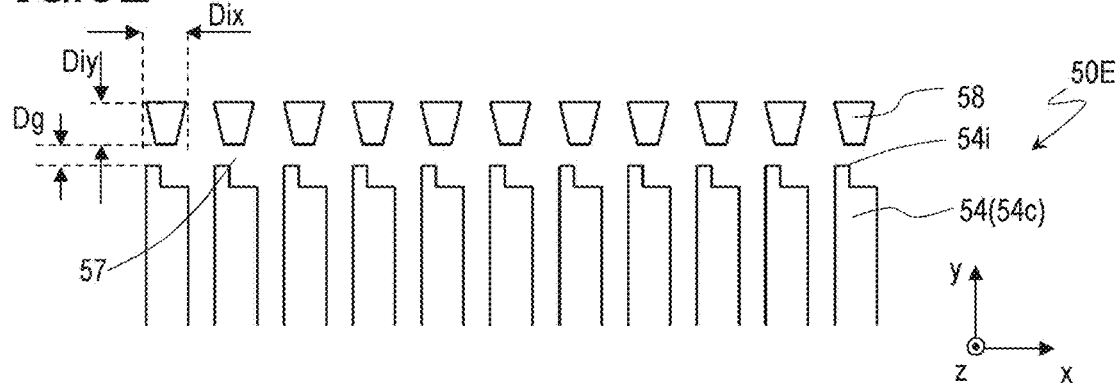
FIG. 5E is a schematic plan view of a printed circuit board included in the display device according to the embodiment of the disclosure.

A distance Deq from an edge of the second substrate 52 to the island conductor 58=0.5 mm The dimension Diy of the island conductor 58=0.3 mm The width Dg of the gap 57=0.1 mm A dimension Dpr of the pressing tool 201=2.0 mm A dimension Dcf of an area in which all of the pressing tool 201, the first wire 34, the anisotropic conductive film 41, and the second wire 54 overlap=1.5 mm A distance Di1 between the insulating layer 36 and the pressing tool 201=0.3 mm A dimension Dc1 of the first connection area 34c=1.8 mm A dimension Dc2 of the second connection area 54c=2.0 mm A dimension Da1 of an area in which the pressing tool 201 and the second insulating layer 56 overlap=0.2 mm A distance Di2 from the end 34i of the first wire 34 to the second insulating layer 56=0.3 mm A distance Da2 from the end 54i of the second wire 54 to the pressing tool 201=0.2 mm A dimension Dcw of an area in which the first wire 34 and the second wire 54 overlap=1.7 mm A dimension Dac of the anisotropic conductive film 41=2.0 mm FIG. 4 illustrates another example of the method for manufacturing the display device according to the embodiment of the disclosure. In the example illustrated in FIG. 4, the gap 57 does not overlap the pressing tool 201 (condition 1 is satisfied), but the island conductors 58 include a portion that does not overlap the first insulating layer 36 (condition 2 is not satisfied). Since condition 1 also satisfied in the example illustrated in FIG. 4, the island conductor 58 and the corresponding first wire 34 is considered to be suppressed from forming connection via the anisotropic conductive layer 40. Although condition 2 is not satisfied in the example illustrated in FIG. 4, since no pressure is applied to the island conductor 58, establishing a connection between the island conductor 58 and the corresponding first wire 34 via the anisotropic conductive layer 40 is difficult. To more reliably suppress the island conductor 58 and the corresponding first wire 34 from forming connection via the anisotropic conductive layer 40, for example, a distance D4 between the island conductor 58 and the pressing tool 201 is desired to be longer than the thickness of the cushion 202.

Both of shapes of the second wires 54 in the second connection area 54c and the island conductors 58 are rectangular in the example illustrated in FIG. 2B, but the shapes of the second wires 54 and the island conductors 58 are not limited thereto.

FIGS. 5A to 5E illustrate other examples of the plane shapes of the second wires 54 and the island conductors 58. FIGS. 5A to 5E each illustrate the shapes of the second wires 54 and the island conductors 58 in the xy plane.

In the examples illustrated in FIGS. 5A to 5E, each of the second wires 54 in the second connection area 54c has a shape which includes two or more parts that have different widths (dimensions in the x-axis direction orthogonal to the y-axis direction) in the direction (y-axis direction) in which the second wire 54 extends and in which a part closer to the end 54i has a narrower width, when viewed in the direction (z-axis direction) normal to the second substrate 52. For example, in a printed circuit board 50A illustrated in FIG. 51A, each of the second wires 54 has a part 54a and a part 54b closer to the end 54i than the part 54a, and a width Dw2 of the part 54b is narrower than a width Dw1 of the part 54a. When the second wire 54 has such a shape, a space between adjacent second wires 54 becomes larger as the space is closer to the ends 54i. Thus, even when an alignment deviation (deviation in the x-axis direction) is caused between the COF board 30 and the printed circuit board 50, it is possible to reduce the possibility that the second wire 54 and the first wire 34 adjacent to the first wire 34 corresponding to the second wire 54 have electrical continuity. For example, the second wire 54 may have a rectangular part, which has a narrow width, in a tip including the end 54i as in a printed circuit board 50D illustrated in FIG. 5D and in a printed circuit board 50E illustrated in FIG. 5E, may have a triangular part in the tip including the end 54i as in a printed circuit board 50B illustrated in FIG. 5B, or may have a trapezoidal part in the tip including the end 54i as in a printed circuit board 50C illustrated in FIG. 5C.

Although the shape of the island conductor 58 is not limited to being rectangular and may be freely modified (into, for example, a polygon including a triangle and a trapezoid, or a circle), for example, as illustrated in FIGS. 5A to 5E, a maximum value of the width (dimension in the x-axis direction) of the island conductor 58 may be approximately equal to the width of the second wire 54 from the viewpoint of improving the bonding strength between the anisotropic conductive layer 40 and the island conductors 58.

A combination of the shape of the second wire 54 and the shape of the island conductor 58 not limited to what is illustrated, and the shapes may be freely combined.

The embodiment of the disclosure is not limited to being applied to liquid crystal display devices but able to be widely applied to active matrix display devices such as organic EL display devices. Moreover, the printed wiring board according to the embodiment of the disclosure is a printed wiring board used for the above-described display device and includes a substrate, a plurality of wires that are supported by the substrate and that have a connection area which includes ends of the plurality of wires, an insulating layer that covers, the plurality of wires such that the connection area is exposed, and a plurality of island conductors that are supported by the substrate and that are adjacent to respective ones of the ends of the plurality of wires across a gap. When a desired electronic component is mounted on the printed wiring board, the printed wiring board is used as the printed circuit board of the display device.

The embodiment of the disclosure is used for a display device that is driven in an active matrix system.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising: a display panel; a flexible circuit board that is connected to the display panel; a printed circuit board that is connected to the flexible circuit board; and an anisotropic conductive layer that connects the flexible circuit board and the printed circuit board, wherein the flexible circuit board includes a first substrate, a first insulating layer on a side of the first substrate, and a plurality of first wires that are provided on the side of the first substrate and each of which has a first portion covered by the first insulating layer and a second portion exposed from the first insulating layer, the printed circuit board includes a second substrate, a second insulating layer on a side of the second substrate, a plurality of second wires that are provided on the side of the second substrate and each of which has a third portion covered by the second insulating layer and a fourth portion exposed from the second insulating layer, and a plurality of island conductors that are provided, each in an electrically floating state and connected to neither other island conductors nor the plurality of second wires, on the side of the second substrate in such a manner as to correspond to respective ones of the plurality of second wires, the fourth portions of the plurality of second wires are arranged next to each other in a first direction and extend in a second direction that is perpendicular to the first direction, the fourth portion of each of the plurality of second wires is longer in the second direction than in the first direction, each of the plurality of second wires has a wire end on one side in the second direction in the fourth portion, the wire end being an end of the second wire in a lengthwise direction, each of the plurality of island conductors is adjacent in the second direction to the wire end of a corresponding one of the plurality of second wires across a gap, the fourth portions of the plurality of second wires are covered with the anisotropic conductive layer, the fourth portion of each of the plurality of second wires at least partially faces the second portion of a corresponding one of the plurality of first wires across the anisotropic conductive layer, and the plurality of island conductors include an island conductor that is in contact with the anisotropic conductive layer and that is partially exposed from the anisotropic conductive layer.

2. The display device according to claim 1, wherein the plurality of island conductors are arranged next to each other in the first direction, and each of the plurality of island conductors is aligned with the wire end of a corresponding one of the plurality of second wires when viewed in the second direction.

3. The display device according to claim 1, wherein the plurality of island conductors are arranged next to each other in the first direction, the wire ends of the plurality of second wires are aligned when viewed in the first direction, and the plurality of second wires and the plurality of island conductors do not overlap when viewed in the first direction.

4. The display device according to claim 1, wherein the gaps for the plurality of island conductors have a substantially equal width.

5. The display device according to claim 1, wherein each of the plurality of island conductors at least partially faces the first portion of a corresponding one of the plurality of first wires across the first insulating layer.

6. The display device according to claim 1, wherein an edge on another side in the second direction in the first insulating layer is located between the wire ends of the plurality of second wires and the plurality of island conductors in the second direction.

7. The display device according to claim 1, wherein the fourth portion of each of the plurality of second wires is contiguous with the third portion on another side in the second direction in the fourth portion.

8. The display device according to claim 1, wherein the second portions of the plurality of first wires are arranged next to each other in the first direction and extend in the second direction, and each of the plurality of first wires has, on another side in the second direction in the second portion, an end in a lengthwise direction of the first wire.

9. The display device according to claim 1, wherein the plurality of island conductors entirely overlap the first insulating layer when viewed in a direction normal to the second substrate.

10. The display device according to claim 1, wherein a width of the gap is twice or more a maximum particle size of conductive particles contained in the anisotropic conductive layer.

11. The display device according to claim 1, wherein a width of the gap is less than or equal to a width of the fourth portion of each of the plurality of second wires.

12. The display device according to claim 1, wherein a width of the gap is greater than or equal to 10 μm.

13. The display device according to claim 1, wherein a dimension of each of the island conductors in the second direction is larger than a width of the gap.

14. The display device according to claim 1, wherein a dimension of each of the island conductors in the second direction is less than or equal to a pitch between the fourth portions of the plurality of second wires.

15. The display device according to claim 1, wherein at least one of the fourth portions of the plurality of second wires has two or more parts, which have different widths, in the second direction when viewed in a direction normal to the second substrate, and, of the two or more parts, a part including the wire end has a narrowest width.

16. The display device according to claim 1, wherein a space between the fourth portions of two second wires of the plurality of second wires, which are adjacent to each other, becomes largest at the wire ends of the two second wires.

17. A method for manufacturing the display device according to claim 1, the method comprising
obtaining the anisotropic conductive layer by heating and pressing an anisotropic conductive film in a state in which the anisotropic conductive film is arranged between the flexible circuit board and the printed circuit board to thereby cure the anisotropic conductive film, wherein
the obtaining includes pressing a pressing tool that is arranged on a side of the flexible circuit board, which is opposite to the anisotropic conductive film, against the printed circuit board via the flexible circuit board and the anisotropic conductive film, and
the gap does not overlap the pressing tool during the pressing when viewed in a direction normal to the second substrate.

18. The method according to claim 17, wherein the first insulating layer does not overlap the pressing tool during the pressing when viewed in the direction normal to the second substrate.

19. The display device according to claim 1, wherein the plurality of island conductors are equal in number to the plurality of second wires.

20. The display device according to claim 1, wherein the first direction is substantially parallel to a side of the display panel, the flexible circuit board being connected to the side.

* * * * *